US007046064B1

(12) United States Patent
Runaldue (10) Patent No.: US 7,046,064 B1
(45) Date of Patent: May 16, 2006

(54) CLOCK GENERATION WITH CONTINUOUS PHASE

(76) Inventor: Thomas Jefferson Runaldue, 3701 Blackford Ave., San Jose, CA (US) 95117-1900

( * ) Notice: Subject to any disclaimer, the term of this patent is extended or adjusted under 35 U.S.C. 154(b) by 0 days.

(21) Appl. No.: 10/817,582

(22) Filed: Apr. 2, 2004

(51) Int. Cl.
*H03H 11/16* (2006.01)

(52) U.S. Cl. ...................... 327/237; 327/356
(58) Field of Classification Search ........ 327/237–239, 327/254–255, 291, 298–299, 361, 355–357
See application file for complete search history.

(56) References Cited

U.S. PATENT DOCUMENTS

| | | | | |
|---|---|---|---|---|
| 4,243,955 A | * | 1/1981 | Daniel et al. ............... | 332/167 |
| 4,270,223 A | * | 5/1981 | Marston ..................... | 455/305 |
| 4,286,268 A | * | 8/1981 | Daniel et al. ............... | 342/379 |
| 4,390,881 A | * | 6/1983 | Lewis et al. ................ | 342/379 |
| 4,739,186 A | * | 4/1988 | Crookshanks ............... | 307/106 |
| 5,901,187 A | * | 5/1999 | Iinuma ...................... | 375/347 |
| 5,937,018 A | * | 8/1999 | Golden ...................... | 375/347 |
| 6,128,276 A | * | 10/2000 | Agee ........................ | 370/208 |

\* cited by examiner

*Primary Examiner*—Kenneth B. Wells
*Assistant Examiner*—Cassandra Cox
(74) *Attorney, Agent, or Firm*—Dinh & Associates (57) ABSTRACT

A clock generation system includes an oscillator and one or more clock generators. The oscillator provides inphase and quadrature oscillator signals having a fixed frequency. Each clock generator receives the oscillator signals and generates a respective output clock signal. Within each clock generator, two weight generators receive two sequences of phase values and generate weights for two analog signals. Two signal generators multiply the inphase and quadrature oscillator signals with the weights from the two weight generators and provide the two analog signals having leading edges determined by the two sequences of phase values. A digital clock generator generates a DCLK signal based on the two analog signals. A divider divides the DCLK signal by N in frequency and provides the output clock signal. A phase generator generates the two sequences of phase values for the two analog signals based on a frequency control value and a phase offset value.

20 Claims, 6 Drawing Sheets

CLOCK GENERATION WITH CONTINUOUS PHASE

BACKGROUND

The present invention relates generally to electronics circuits, and more specifically to techniques for generating clock signals with continuous phase.

Clock signals are commonly used in various electronics circuits such as personal computers, consumer electronics, network equipments, and so on. Clock signals are widely used for digital circuits, e.g., to trigger synchronous circuits such as flip-flops. Clock signals are also used for analog circuits, e.g., to generate local oscillator (LO) signals used for frequency upconversion and downconversion. A clock signal is often generated using a phase-locked loop (PLL).

Figure 1:
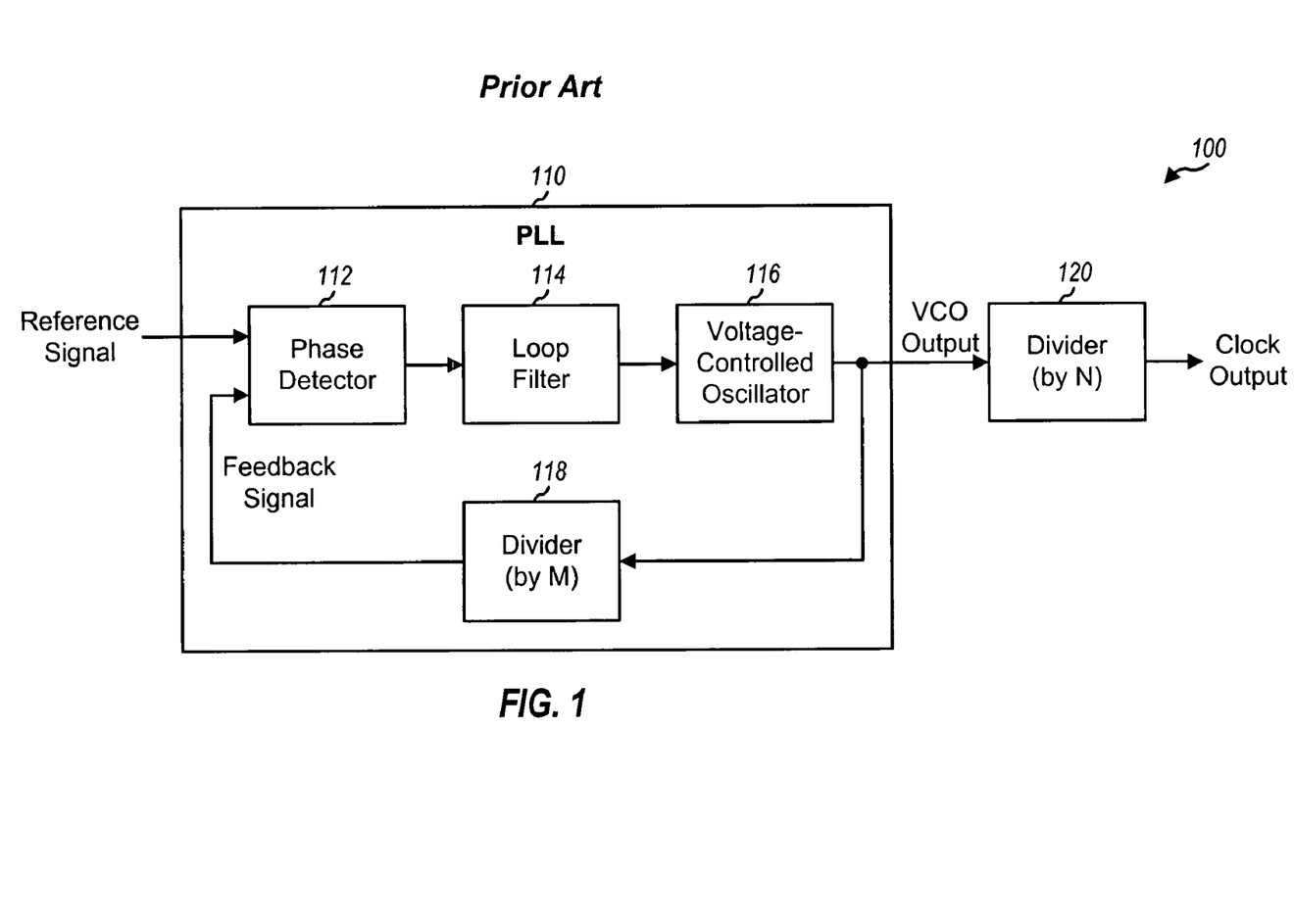
FIG. 1 shows a conventional clock generator.

FIG. 1 shows a conventional clock generator 100, which consists of a PLL 110 and a divider 120. PLL 110 includes a phase detector 112, a loop filter 114, a voltage controlled oscillator (VCO) 116, and a divider 118. VCO 116 generates a VCO signal having a frequency determined by a control signal from loop filter 114. Divider 118 divides the VCO signal by a factor of M in frequency and provides a feedback signal. Phase detector 112 receives a reference signal and the feedback signal from divider 118, compares the phases of the two signals, and provides a detector signal that is proportional to the detected phase difference between the two signals. Loop filter 114 filters the detector signal and provides the control signal for VCO 116. Loop filter 114 adjusts the control signal such that the frequency of the feedback signal is locked to that of the reference signal. Divider 120 divides the VCO signal by a factor of N in frequency and provides an output clock signal. M and N are integers that may be one or greater.

In clock generator 100, divider 118 is effectively used to multiply the reference signal by a factor of M in frequency to produce the VCO signal. Since divider 118 is in the feedback path of PLL 110, phase detector 112 provides the appropriate adjustments to loop filter 114 to maintain frequency lock between the feedback signal and the reference signal. When locked, the VCO signal has a frequency that is M times that of the reference signal. Divider 120 simply divides down the VCO signal by a factor of N in frequency. The output clock frequency, $f_{out}$, may be expressed in terms of the reference signal frequency, $f_{ref}$, as follows:

$$f_{out} = \frac{M}{N} \cdot f_{ref}. \quad \text{Eq (1)}$$

Conventional clock generator 100 has several key limitations. A first key limitation is the inability to achieve a precise output clock frequency. Equation (1) indicates that the desired output clock frequency, $f_{out}$, can be obtained by selecting suitable values for M and N for a given reference frequency, $f_{ref}$. However, the possible values for M are constrained to be within a specified range, which is determined by the frequency range of VCO 116 as well as the reference frequency. For example, if the VCO has an operating frequency range of 320 MHz to 640 MHz and the reference frequency is 20 MHz, then M is constrained to be between 16 and 32. In this example, it would not be possible to generate an output clock with a frequency of 17.25 MHz. Improved precision may be achieved by adjusting the reference frequency. However, this is undesirable or not practical in many instances. A second key limitation of clock generator 100 is the inability to generate multiple output clock signals having flexible frequencies. Multiple dividers 120 may be used to divide down the VCO signal with different N integer values to obtain clock signals at different frequencies. However, the frequencies of these clock signals would be restricted to integer divisors of the VCO signal frequency, $f_{vco}$, or $f_{out\ 1} = f_{vco}/N_1$, $f_{out\ 2} = f_{vco}/N_2$, and so on.

A clock device with multiple PLLs can generate multiple clock signals having different and more flexible frequencies. Each PLL may be operated with a different set of M and N values to allow for greater precision in the output clock frequency. However, the multiple-PLL design also has several disadvantages. First, using multiple PLLs on a single monolithic device is often problematic because of noise coupling between the PLLs (i.e., the noise from one PLL interacting with another PLL), which can degrade performance. Second, the same reference signal is typically used for all PLLs within the device, which then limits the precision that can be achieved for the output clock frequencies. For the example described above, output clocks of 17.5 MHz and 34.5 MHz cannot be obtained for a reference frequency of 20 MHz even if multiple PLLs are employed. Third, a larger die size is required to fabricate the multiple PLLs, which increases cost. A PLL typically employs capacitors for charge reservoirs that maintain the control voltages for the loop filter and the VCO and for power supply noise filtering. For some PLL designs, these capacitors may occupy a large percentage (e.g., 80 to 90 percent) of the total die area for the PLL. The use of multiple PLLs thus incurs a substantial penalty in die area.

As can be seen, techniques that can generate clock signals with good frequency resolution and which avoid the disadvantages described above for the multiple-PLL design are highly desirable.

SUMMARY

Techniques for generating one or more output clock signals having frequencies and phases that can be individually programmed with fine resolution are described herein. Each output clock signal is generated based on a respective internal digital clock (DCLK) signal. The desired frequency and phase for each output clock signal can be obtained by continually selecting the proper timing for each edge in the DCLK signal, where the timing can be given in terms of the phase of an oscillator signal having a fixed frequency.

In an embodiment, a clock generation system includes an oscillator (e.g., a VCO) and K clock generators, where $K \geq 1$. The oscillator provides an inphase oscillator signal and a quadrature oscillator signal, which are 90 degrees out of phase with respect to each other. The oscillator can operate at a fixed frequency and may be part of a fixed PLL. Each clock generator receives the inphase and quadrature oscillator signals and generates a respective output clock signal.

In an embodiment, each clock generator includes first and second weight generators, first and second signal generators, an internal digital clock generator, a divider, and a phase generator. The first and second weight generators receive first and second sequences of phase values for first and second analog signals, respectively. Each weight generator provides an inphase weight and a quadrature weight for each phase value in its sequence of phase values. The first signal generator multiplies the inphase and quadrature oscillator signals with the inphase and quadrature weights, respectively, from the first weight generator and provides the first analog signal having leading edges determined by the phase values in the first sequence. The second signal generator multiplies the inphase and quadrature oscillator signals with inphase and quadrature weights, respectively, from the second weight generator and provides the second analog signal having leading edges determined by the phase values in the second sequence. The first and second analog signals have the same frequency, which is determined by the sequences of phase values. The digital clock generator generates a third analog signal having a leading edge for each leading edge in the first and second analog signals and further generates a DCLK signal having a frequency that is half of the frequency of the third analog signal. The divider divides the DCLK signal down in frequency by a factor of N and provides the output clock signal. The phase generator generates the first and second sequences of phase values for the first and second analog signals, respectively, based on a frequency control value and a phase offset value.

Various aspects, embodiments, and features of the invention are described in further detail below.

DETAILED DESCRIPTION

Figure 2:
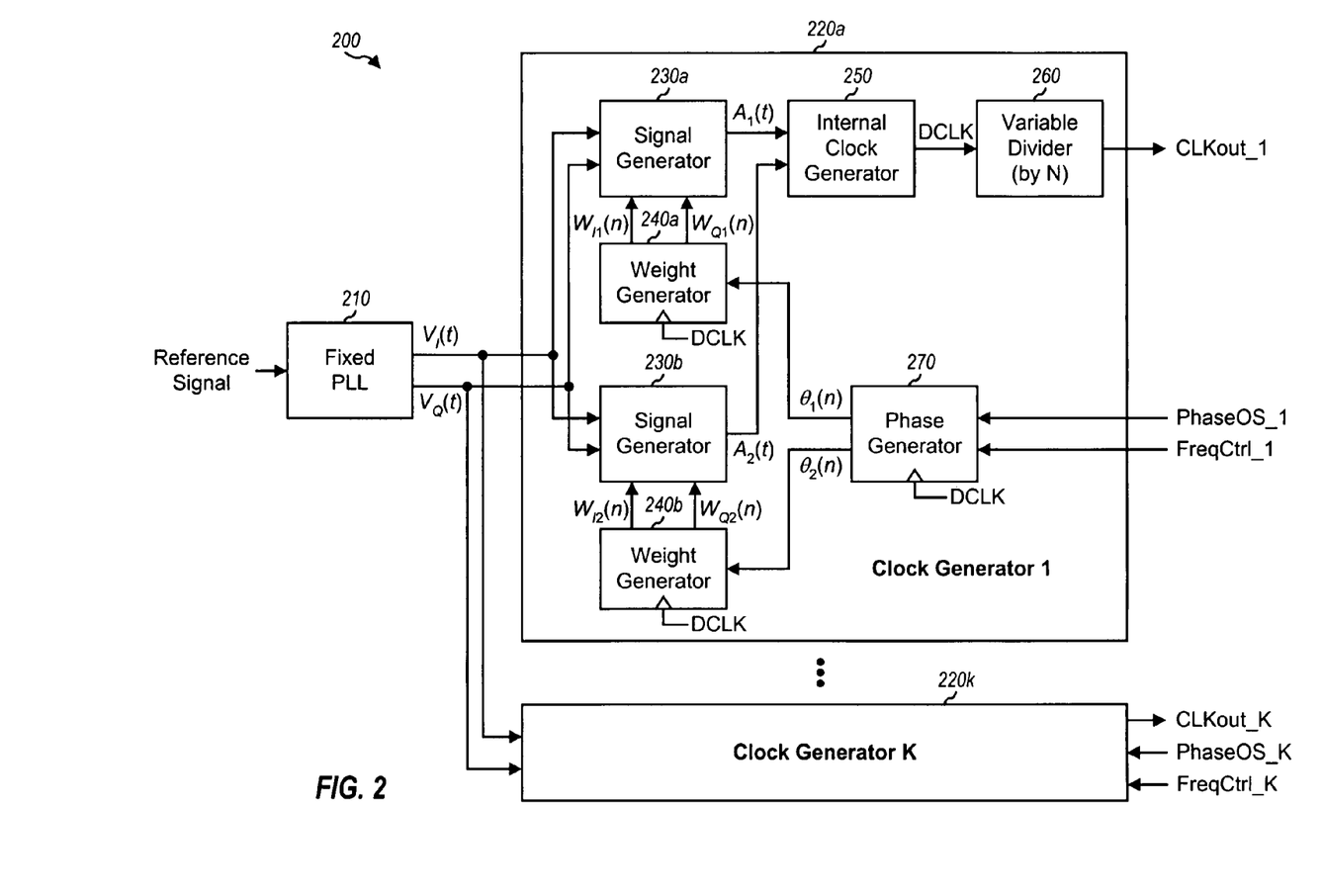
FIG. 2 shows a clock generation system with K clock generators for K output clock signals having individually programmable frequencies.

FIG. 2 shows a block diagram of an embodiment of a clock generation system 200 that can generate K output clock signals having frequencies that can be individually programmed with fine resolution. In general, K may be any integer one or greater. System 200 generates the K output clock signals based on a common VCO signal having a fixed frequency.

System 200 includes a PLL 210 and K clock generators 220a through 220k. PLL 210 receives a reference signal having a frequency of $f_{ref}$ and generates an inphase VCO signal, $V_I(t)$, and a quadrature VCO signal, $V_Q(t)$, having a frequency of $f_{vco}$. The frequencies of the reference signal and the VCO signal can be fixed and may be selected based on the application in which system 200 is used, as described below. The inphase and quadrature VCO signals are provided to each of the K clock generators 220a through 220k.

Each clock generator 220 includes signal generators 230a and 230b, weight generators 240a and 240b, an internal clock generator 250, a variable divider 260, and a phase generator 270. Signal generator 230a receives the inphase and quadrature VCO signals from PLL 210 and weights $W_{I1}(n)$ and $W_{Q1}(n)$ from weight generator 240a and generates a first analog signal, $A_1(t)$, based on the $V_I(t)$ and $V_Q(t)$ signals and the $W_{I1}(n)$ and $W_{Q1}(n)$ weights. Here, t is a variable for time, and n is an index for clock cycle in the DCLK signal. Similarly, signal generator 230b receives the inphase and quadrature VCO signals from PLL 210 and weights $W_{I2}(n)$ and $W_{Q2}(n)$ from weight generator 240b and generates a second analog signal, $A_2(t)$, based on the $V_I(t)$ and $V_Q(t)$ signals and the $W_{I2}(n)$ and $W_{Q2}(n)$ weights. The first and second analog signals can have arbitrary phases determined by the weights used to generate these signals, as described below.

Internal clock generator 250 receives the first and second analog signals and generates an internal digital clock (DCLK) signal having a frequency of $f_{dclk}$, where $f_{vco}/2 \leq f_{dclk} \leq f_{vco}$. Variable divider 260 then divides the DCLK signal down in frequency by a factor of N and provides an output clock (CLKout) signal having a frequency of $f_{out}$. In general, N may be any integer one or greater, and the output clock frequency may be expressed as: $f_{out} = f_{dclk}/N$.

Phase generator 270 receives a frequency control value, FreqCtrl, and a phase offset value, PhaseOS, and dynamically generates $\theta_1(n)$ and $\theta_2(n)$ phase values for the first and second analog signals, respectively. The phase values are such that the desired output clock frequency and phase offset can be achieved for the output clock signal, as described below. Weight generators 240a and 240b receive the $\theta_1(n)$ and $\theta_2(n)$ phase values, respectively, and generate the corresponding weights for signal generators 230a and 230b, respectively. Each of the units in clock generator 220 is described in further detail below.

Figure 3:
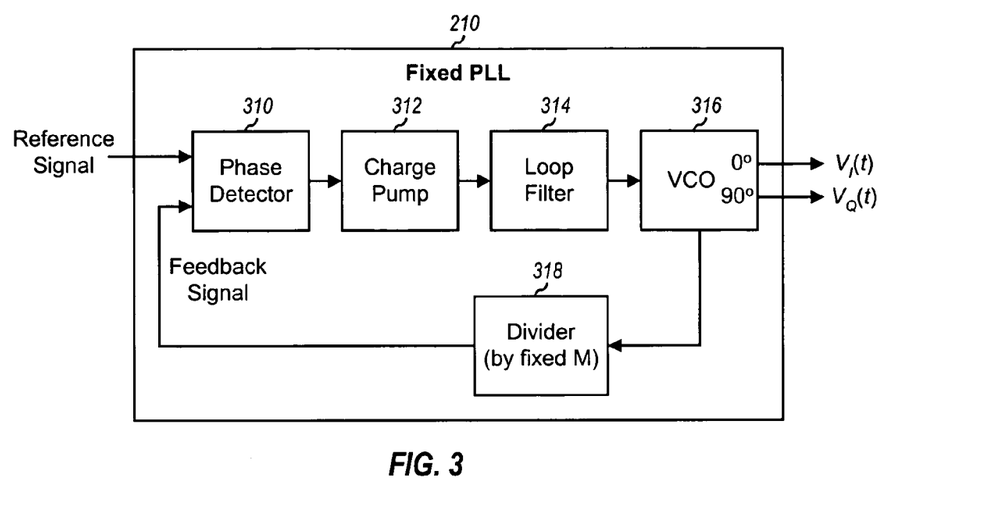
FIG. 3 shows a fixed PLL for the clock generation system.

FIG. 3 shows a block diagram of an embodiment of PLL 210. PLL 210 includes a phase detector 310, a charge pump 312, a loop filter 314, a VCO 316, and a divider 318. VCO 316 generates the inphase and quadrature VCO signals, with the quadrature VCO signal leading the inphase VCO signal by 90 degrees. The design of such a VCO is known in the art. VCO 316 may be implemented with differential circuits that operate on different signals, which can provide improved performance such as better rejection of power supply noise, greater linearity, and so on. Each differential signal is made up of two single-ended signals that are 180 degrees out of phase with respect to each other. For a differential design, the inphase VCO signal is provided as one differential VCO signal that is associated with phases of 0° and 180°, and the quadrature VCO signal is provided as another differential VCO signal that is associated with phases of 90° and 270°.

Divider 318 divides one of the VCO signals (e.g., the VCO signal with a phase of 0°) in frequency by a factor of M, where M is a fixed integer value, and provides a feedback signal. Phase detector 310 receives a reference signal and the feedback signal from divider 318, compares the phases of the two signals, and provides a detector output signal that indicates the detected phase difference between the reference and feedback signals. Phase detector 310 may be implemented with an early-late detector, which is well-known in the art. Charge pump 312 converts the detector output signal into a current signal. Loop filter 314 filters the current signal and provides a control signal for VCO 316. Loop filter 314 adjusts the control signal such that the phase of the feedback signal is locked to that of the reference signal.

For clock generation system 200, the reference signal can have a fixed frequency, and the VCO signals can also have a fixed frequency. Divider 318 operates with a fixed value for M, which is selected based on the VCO signal frequency and the reference signal frequency, or $M = f_{vco}/f_{ref}$. For example, M=32 for $f_{vco}$=640 MHz and $f_{ref}$=20 MHz, M=64 for $f_{vco}$=640 MHz and $f_{ref}$=10 MHz, and so on. The reference and VCO frequencies can be selected based on the application where system 200 will be used, the IC process used to fabricate the PLL, and so on. A "fixed" PLL with a fixed VCO frequency, a fixed reference frequency, and a fixed M value may be more optimally designed for performance and cost. For example, the overall loop gain, loop bandwidth and damping, capacitor size, stability, and so on, may be more optimally designed for the fixed PLL.

The inphase and quadrature VCO signals may be expressed as follows:

$$V_I(t)=\cos(\omega t) \text{ and } V_Q(t)=\sin(\omega t), \quad \text{Eq (2)}$$

where $\omega=2\pi \cdot f_{vco}$. The inphase and quadrature VCO signals may be used to generate an analog signal, A(t), of any arbitrary phase by appropriately weighting the inphase and quadrature VCO signals and combining the weighted signals, as follows:

$$A(t)=W_I \cdot V_I(t)+W_Q \cdot V_Q(t)=W_I \cos(\omega t)+W_Q \sin(t)=\sin(\omega t+\theta), \quad \text{Eq (3)}$$

$$\text{where } \theta = \arctan\left(\frac{W_Q}{W_I}\right). \quad \text{Eq (4)}$$

Figure 4:
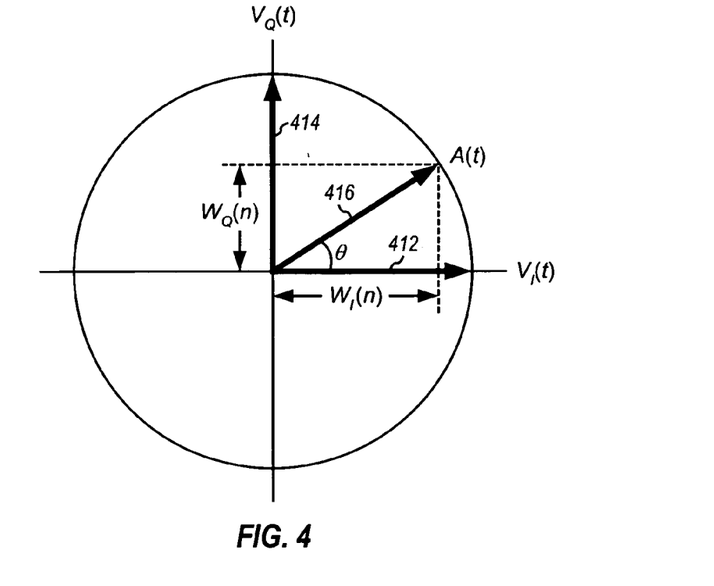
FIG. 4 illustrates the generation of an analog signal with an arbitrary phase based on inphase and quadrature VCO signals.

FIG. 4 illustrates the generation of the A(t) analog signal based on the inphase and quadrature VCO signals. The inphase VCO signal is shown by a phasor 412, and the quadrature VCO signal is shown by a phasor 414. For a given pair of values for the $W_I$ and $W_Q$ weights, where $\sqrt{W_I^2+W_Q^2}=1$, the A(t) signal is shown by a phasor 416. Phasor 416 is offset from phasor 412 by a phase of θ, where θ is determined by the $W_I$ and $W_Q$ weights, as shown in equation (4). As can be seen from FIG. 4, any arbitrary phase θ can be obtained by selecting the appropriate values for the weights. Each weight can take on a positive or negative value and is within a range of +1.0 to −1.0. Phasors 412, 414, and 416 rotate counter-clockwise at a rate of $\omega=2\pi \cdot f_{vco}$ radians/sec. FIG. 4 shows the three phasors at a specific time instant when the inphase VCO signal has a phase of 0°, or $\angle V_I(t)=0°$.

Figure 5:
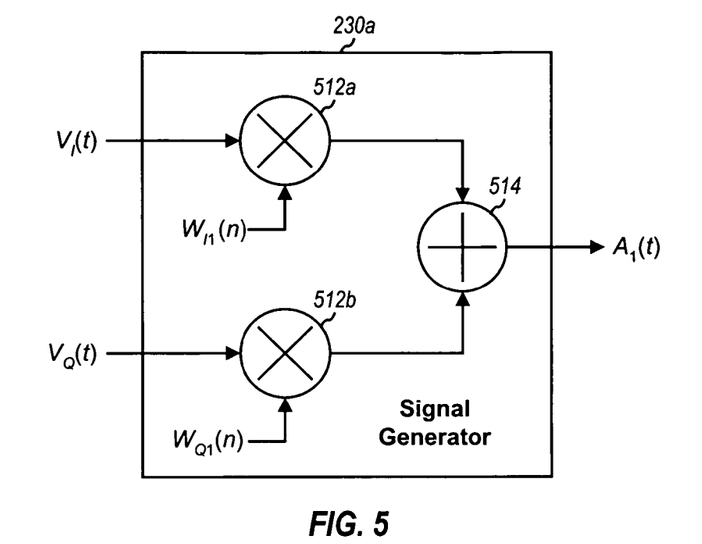
FIG. 5 shows a signal generator for a clock generator.

FIG. 5 shows a block diagram of an embodiment of signal generator 230a. Within signal generator 230a, a multiplier 512a receives and multiplies the inphase VCO signal with the $W_{I1}(n)$ weights and provides a weighted inphase signal to a summer 514. A multiplier 512b receives and multiplies the quadrature VCO signal with the $W_{Q1}(n)$ weights and provides a weighted quadrature signal to summer 514. The $W_{I1}(n)$ and $W_{Q1}(n)$ weights can change for each clock period n and are dependent on the $\theta_1(n)$ phase value, as described below. Summer 514 sums the weighted inphase and quadrature signals and provides the first analog signal, $A_1(t)$.

Multipliers 512a and 512b and summer 514 may be implemented in various manners. For example, each of multipliers 512a and 512b may be implemented with a four-quadrant multiplier (e.g., a Gilbert cell multiplier), and summer 514 may be implemented by simply summing the output currents from the multipliers, as is known in the art. As another example, each of multipliers 512a and 512b may be implemented with two two-quadrant multipliers, which may be easier to implement than a four-quadrant multiplier. One two-quadrant multiplier for multiplier 512a would then multiply the $V_I(t)=\cos(\omega t)$ signal with the $W_{I1}(n)$ weight, and the other two-quadrant multiplier would multiply the complementary $\overline{V_I(t)}=\cos(\omega t+\pi)$ signal with the complementary $\overline{W_{I1}(n)}$ weight. Similarly, one two-quadrant multiplier for multiplier 512b would multiply the $V_Q(t)=\sin(\omega t)$ signal with the $W_{Q1}(n)$ weight, and the other two-quadrant multiplier would multiply the complementary $\overline{V_Q(t)}=\sin(\omega t+\pi)$ signal with the complementary $\overline{W_{Q1}(n)}$ weight. A summer would then sum the output currents from all four two-quadrant multipliers to obtain the first analog signal, $A_1(t)$.

Signal generators 230b in FIG. 2 may be implemented in the same manner as signal generator 230a. However, the two multipliers for signal generator 230b would be provided with the $W_{I2}(n)$ and $W_{Q2}(n)$ weights generated for the $\theta_2(n)$ phase values. The summer for signal generators 230b would provide the second analog signal, $A_2(t)$.

The first and second analog signals are used to generate an analog clock (ACLK) signal having the desired frequency and phase. This can be achieved by generating the leading edges of the ACLK signal based on the leading edges of the $A_1(t)$ and $A_2(t)$ signals from signal generators 230a and 230b, respectively. The leading edges of the $A_1(t)$ and $A_2(t)$ signals can, in turn, be controlled by selecting the proper $\theta_1(n)$ and $\theta_2(n)$ phase values, respectively.

Two analog signals are used to generate the ACLK signal to provide sufficient settling time for these two analog signals. Whenever the phase is changed for a given analog signal, a finite amount of time is required for the analog signal to settle to the proper value. The two analog signals, $A_1(t)$ and $A_2(t)$, are thus used to generate the ACLK signal in a ping-pong manner such that each analog signal is used to generate every other leading edge of the ACLK signal. While signal generator 230a is providing the $A_1(t)$ signal with the desired phase for a first leading edge of the ACLK signal, the other signal generator 230b is generating the $A_2(t)$ signal with the desired phase for a second ACLK leading edge. A positive zero crossing on the $A_1(t)$ signal provides the first leading edge on the ACLK signal. Once this zero crossing has been sensed, signal generator 230b then provides the $A_2(t)$ signal with the desired phase for the second ACLK leading edge, and signal generator 230a is loaded with a new phase value for a third ACLK leading edge and begins generating the $A_1(t)$ signal with the new phase. A positive zero crossing on the $A_2(t)$ signal provides the second ACLK leading edge. Once this zero crossing has been sensed, signal generator 230a again provides the $A_1(t)$ signal with the desired phase for the third ACLK leading edge, and signal generator 230b is loaded with a new phase value for a fourth ACLK leading edge and begins generating the $A_2(t)$ signal with the new phase. The operation continues in this manner, switching back and forth between the two analog signals from the two signal generators.

Figure 6:
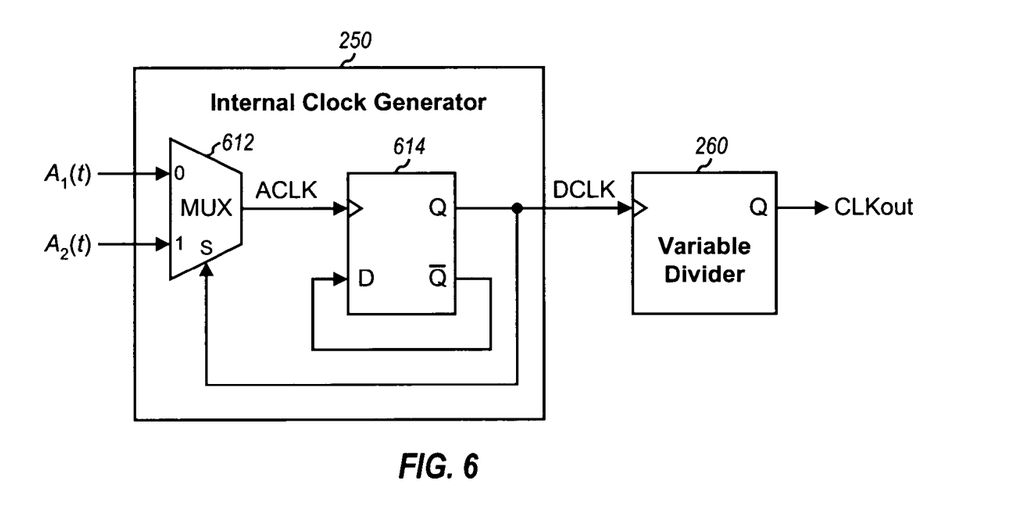
FIG. 6 shows an internal clock generator for the clock generator.

FIG. 6 shows a block diagram of an embodiment of internal clock generator 250. A multiplexer 612 receives the $A_1(t)$ signal from signal generator 230a at a '0' input, the $A_2(t)$ signal from signal generator 230b at a '1' input, and the DCLK signal at a select (S) input. Multiplexer 612 passes the $A_1(t)$ signal as the ACLK signal if the DCLK signal is at logic low ('0') and passes the $A_2(t)$ signal as the ACLK signal if the DCLK signal is at logic high ('1'). A D-type flip-flop 614 is coupled in a divide-by-two configuration and has its inverted ($\overline{Q}$) output coupled to its D input. Flip-flop 614 receives the ACLK signal at its clock input and provides the DCLK signal from its non-inverted (Q) output.

Figure 7:
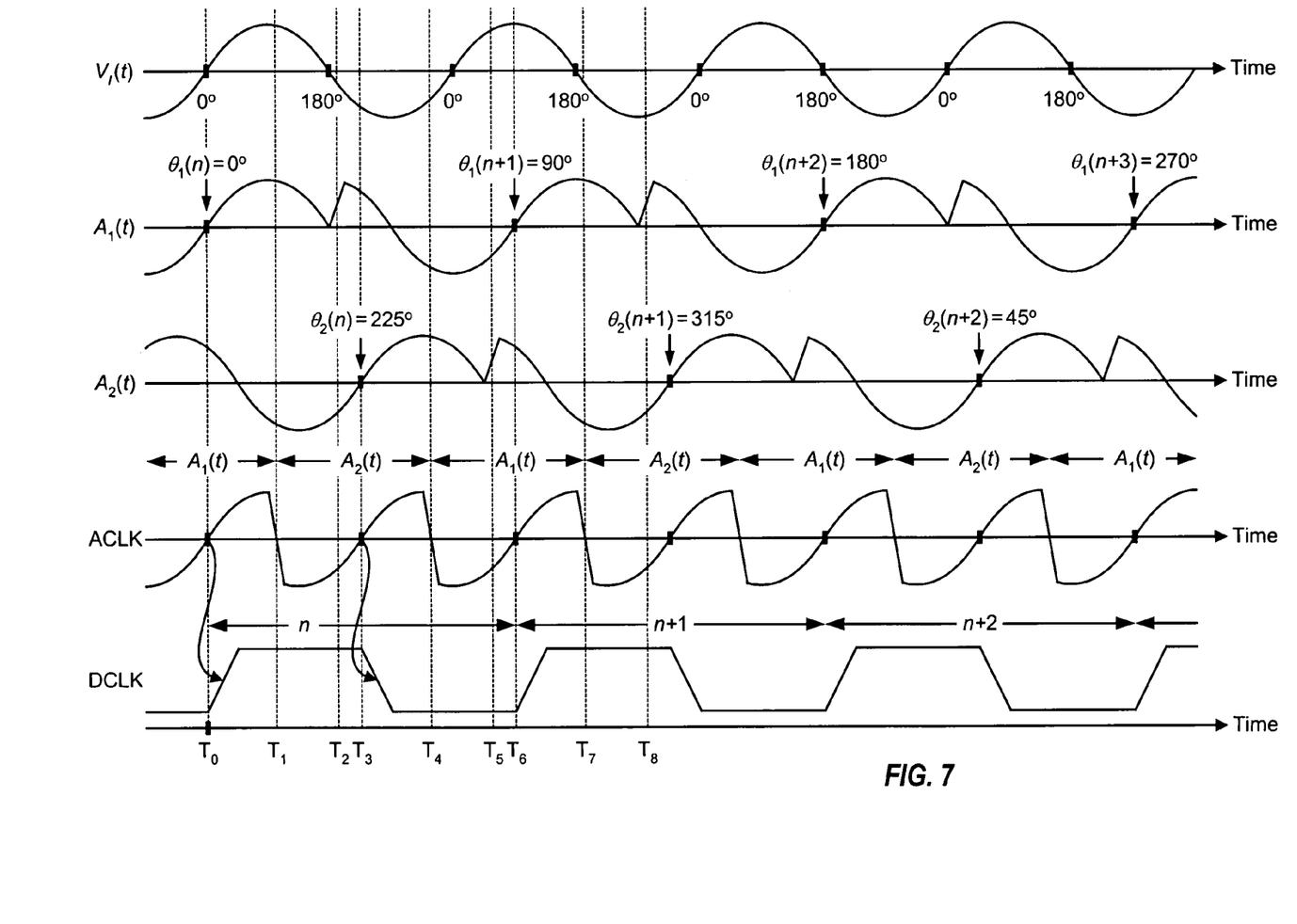
FIG. 7 illustrates the operation of the clock generator.

FIG. 7 shows a timing diagram that illustrates the operation of clock generation system 200. The inphase VCO signal, $V_I(t)$, is shown at the top of FIG. 7 as a continuous sinusoidal signal. The two analog signals, $A_1(t)$ and $A_2(t)$, the ACLK signal, and the DCLK signal are shown in FIG. 7 below the $V_I(t)$ signal. In this example, the frequency control value is set to provide a DCLK of $f_{dclk}=(4/5) \cdot f_{vco}$.

Prior to time $T_0$, signal generator 230a generates the $A_1(t)$ signal with a phase of $\theta_1(n)=0°$, and signal generator 230b generates the $A_2(t)$ signal with a phase of $\theta_2(n)=225°$. Since the DCLK signal is at logic low, multiplexer 612 provides the $A_1(t)$ signal as the ACLK signal. The $A_1(t)$ signal has a zero crossing at time $T_0$, which corresponds to a phase of 0° on the $V_f(t)$ signal. This zero crossing triggers flip-flop 614, which causes the DCLK signal to transition to logic high, which in turn causes new weights for a new phase value of $\theta_1(n+1)=90°$ to be generated for signal generator 230a. At time $T_1$, after a short propagation delay, multiplexer 612 provides the $A_2(t)$ signal as the ACLK signal. At time $T_2$, the new weights for signal generator 230a take effect, which then starts generating the $A_1(t)$ signal with the new phase of $\theta_1(n+1)=90°$.

The $A_2(t)$ signal has a zero crossing at time $T_3$, which corresponds to a phase of 225° on the $V_f(t)$ signal. This zero crossing triggers flip-flop 614, which causes the DCLK signal to transition to logic low, which in turn causes new weights for a new phase value of $\theta_2(n+1)=315°$ to be generated for signal generator 230b. At time $T_4$, multiplexer 612 provides the $A_1(t)$ signal as the ACLK signal. At time $T_5$, the new weights for signal generator 230b take effect, which then starts generating the $A_2(t)$ signal with the new phase of $\theta_2(n+1)=315°$.

The $A_1(t)$ signal has a zero crossing at time $T_6$, which corresponds to a phase of 90° on the $V_f(t)$ signal. This zero crossing triggers flip-flop 614, which causes the DCLK signal to transition to logic high, which in turn causes new weights for a new phase value of $\theta_1(n+2)=180°$ to be generated for signal generator 230a. At time $T_7$, multiplexer 612 provides the $A_2(t)$ signal as the ACLK signal. At time $T_8$, the new weights for signal generator 230a take effect, which then starts generating the $A_1(t)$ signal with the new phase of $\theta_1(n+2)=180°$.

As shown in FIG. 7, the $\theta_1(n)$ phase values for signal generator 230a determine the zero crossings on the $A_1(t)$ signal, which in turn determine the leading edges of the DCLK signal. The $\theta_2(n)$ phase values for signal generator 230b determine the zero crossings on the $A_2(t)$ signal, which in turn determine the trailing edges of the DCLK signal. The ACLK signal is not a true sinusoidal signal but has leading edges corresponding to those of the $A_1(t)$ and $A_2(t)$ signals, i.e., each leading edge of the ACLK signal is generated based on a leading edge in the $A_1(t)$ or $A_2(t)$ signal. The edge rate of the ACLK signal is variable and ranges from $f_{vco}$ to $2f_{vco}$. The frequency of the DCLK signal is half of the edge rate of the ACLK signal and ranges from $f_{vco}/2$ to $f_{vco}$.

Figure 8:
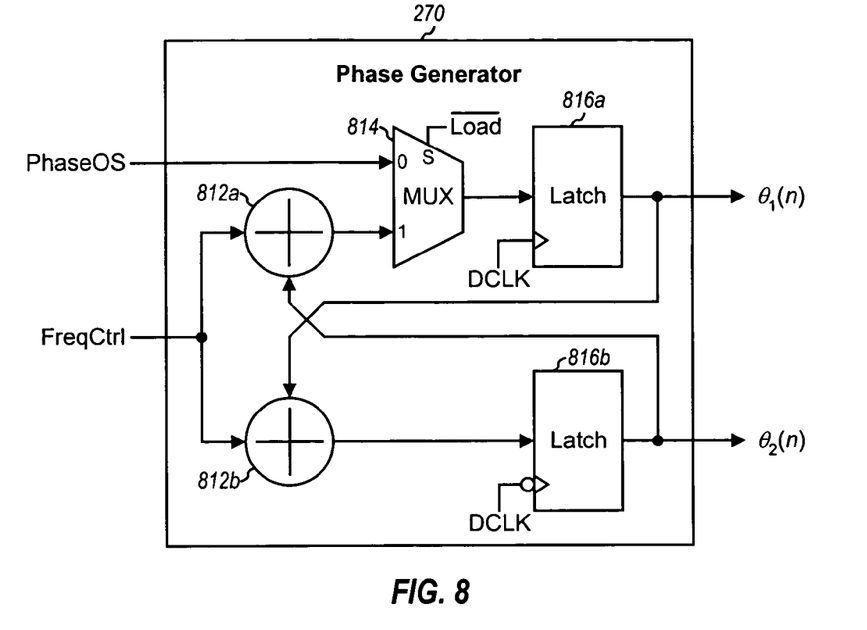
FIG. 8 shows a phase generator for the clock generator.

FIG. 8 shows a block diagram of an embodiment of phase generator 270 within clock generator 220. Phase generator 270 receives the frequency control value, FreqCtrl, and the phase offset value, PhaseOS, for clock generator 220 and generates the $\theta_1(n)$ and $\theta_2(n)$ phase values for the $A_1(t)$ and $A_2(t)$ signals, respectively.

Within phase generator 270, the frequency control value is provided to adders 812a and 812b. Adder 812a also receives the output of a latch 816b, sums the two inputs, and provides its output to a '1' input of a multiplexer 814. Multiplexer 814 also receives the phase offset value at its '0' input and a $\overline{Load}$ signal at its select input, provides the phase offset value to a latch 816a if the $\overline{Load}$ signal is at logic low, and provides the output of adder 812a to latch 816a if the Load signal is at logic high. Latch 816a latches the output of multiplexer 814 with the leading edge of the DCLK signal and provides the $\theta_1(n)$ phase value. Similarly, adder 812b also receives the output of latch 816a, sums the two inputs, and provides its output to latch 816b. Latch 816b latches the output of adder 812b with the trailing edge of the DCLK signal and provides the $\theta_2(n)$ phase value.

Phase generator 270 operates as follows. Initially, the $\overline{Load}$ signal is brought to logic low for one clock cycle, and the phase offset value is routed through multiplexer 814, latched by latch 816a on the next leading edge of the DCLK signal, and provided as the $\theta_1(n)$ phase value. The $\theta_1(n)$ phase value is then added with the frequency control value by adder 812b, and the result is latched by latch 816b on the next trailing edge of the DCLK signal and provided as the $\theta_2(n)$ phase value. The processing continues back and forth in this manner between the upper branch for the $\theta_1(n)$ phase value and the lower branch for the $\theta_2(n)$ phase value, with the upper branch operating on the leading edges of the DCLK signal and the lower branch operating on the trailing edges of the DCLK signal.

Adders 812a and 812b, multiplexer 814, and latches 816a and 816b are implemented with $L_{acc}$ bits of precision, where $L_{acc}$ may be any integer value. For example, if $L_{acc}=16$, then the output clock frequency can have a resolution of approximately 15 parts per million (ppm), or $10^6/2^{16}=15.3$ ppm. Greater frequency resolution may be achieved by using more bits for the adders and latches. Adders 812a and 812b are wrapped-around adders that provide the $L_{acc}$ least significant bits (LSBs) of their results to latches 816a and 816b, respectively. The full value of each latch represents 360°, or one period of the DCLK signal. The $\theta_1(n)$ and $\theta_2(n)$ phase values have $L_{ph}$ bits of resolution, where $L_{ph}$ may be equal to or less than $L_{acc}$, i.e., $L_{ph} \geq L_{acc}$. For example, if $L_{ph}=8$ bits are used for $\theta_1(n)$ and $\theta_2(n)$, then the phase values can have a resolution of 1.4°, or $360°/2^8=1.4$. If the VCO frequency is 640 MHz, which corresponds to a period of 1.5626 nano seconds (nsec), then the $\theta_1(n)$ and $\theta_2(n)$ phase values can have a resolution of 6.1 pico seconds (psec), or 1.5626 nsec/$2^8$=6.1 psec. In summary, $L_{acc}$ determines the frequency resolution for the output clock signal, and $L_{ph}$ determines the phase resolution for the output clock signal.

The frequency control value, FreqCtrl, determines the frequency and period of the output clock signal. For the embodiment shown in FIG. 8, the frequency control value indicates the amount of phase adjustment to make for each full cycle of the ACLK signal, or equivalently, for each half cycle of the DCLK signal. For this embodiment, the relationship between the DCLK frequency, the ACLK frequency, and the frequency control value may be expressed as:

$$2 \cdot f_{dclk} = f_{aclk} = f_{vco} \cdot \frac{2^{L_{acc}}}{FreqCtrl}. \quad \text{Eq (5)}$$

The frequency control value may be constrained to be between $L_{acc}/2$ and $L_{acc}$, or $2^{L_{acc}-1} \leq FreqCtrl \leq 2^{L_{acc}}$. For example, if the frequency control value is set to half of the full value for the latches, or FreqCtrl=$2^{L_{acc}-1}$, then the ACLK signal has a frequency that is twice the VCO frequency. If the frequency control value is set to the full value for the latches, or FreqCtrl=$2^{L_{acc}}$, then the ACLK signal has a frequency that is equal to the VCO frequency.

The phase offset value determines the initial offset from the phase of the VCO signal at the time the $\overline{Load}$ signal is brought to logic low. If multiple output clock signals with the same output frequency are generated based on the same VCO signals from fixed PLL 210 using multiple clock generators 220, as shown in FIG. 2, then the phases of these multiple output clock signals may be controlled relative to each other by selecting the proper phase offset values for these multiple clock generators. This allows each output clock signal to be set to lead or lag another output clock signal by some fixed amount determined by the difference between their phase offset values. The phase offset can be set with a resolution of $1/(2^{L_{ph}} \cdot f_{vco})$, which is 6.1 psec for the example described above with $f_{vco}$=640 MHz and $L_{ph}$=8. For this example, to achieve a phase lead of 250 psec for a given output clock signal, a phase offset value of 41 may be programmed for this output clock signal, or 41×6.1 psec=250.1 psec.

For the embodiment shown in FIG. 8, the frequency control value determines the period of one full cycle of the ACLK signal and is thus inversely related to the frequency of the ACLK signal, as shown in equation (5). In general, the frequency control value may indicate a period value, a phase value, or some other time-related value (such as for the embodiment shown in FIG. 8) or a frequency value (for other embodiments of the phase generator).

Figure 9:
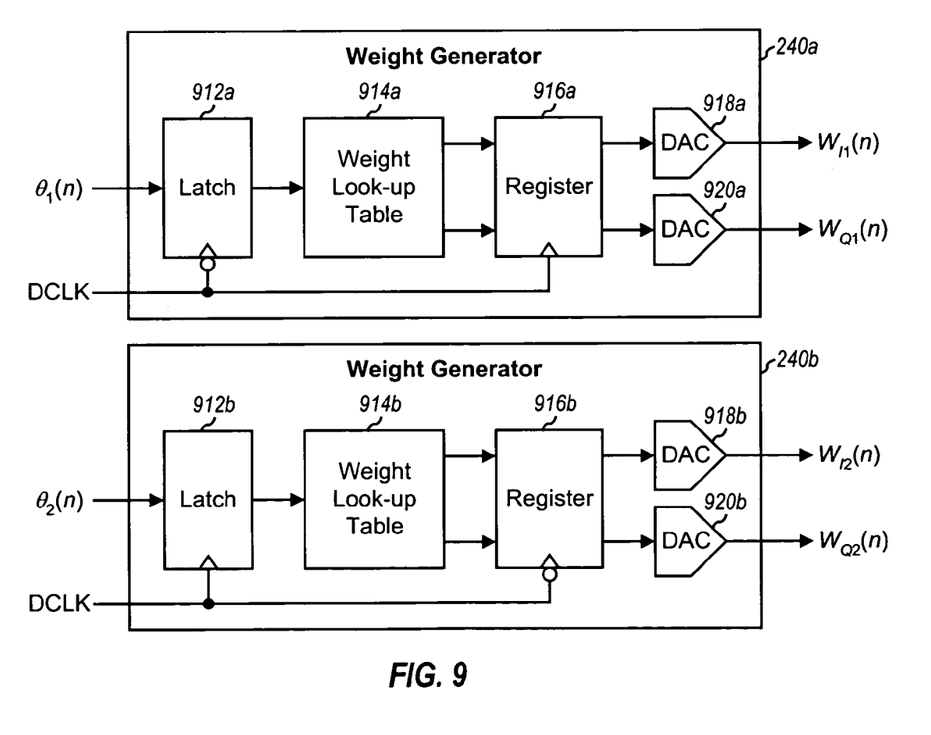
FIG. 9 shows weight generators for the clock generator.

FIG. 9 shows a block diagram of an embodiment of weight generators 240*a* and 240*b*. Within weight generator 240*a*, the $L_{ph}$-bit $\theta_1(n)$ phase values are latched by a latch 912*a* with the trailing edges of the DCLK signal and provided to a weight look-up table 914*a*. Look-up table 914*a* implements a sine and cosine look-up table and provides the sine and cosine for each $\theta_1(n)$ phase value, as follows:

$$s_1(n)=\sin(\theta_1(n)) \text{ and } c_1(n)=\cos(\theta_1(n)).\qquad\text{Eq (6)}$$

As shown in FIG. 4, the sine and cosine functions are symmetric. Thus, instead of storing $2^{L_{ph}}$ values for the sine function and another $2^{L_{ph}}$ values for the cosine function, only $2^{L_{ph}}/8$ values need to be stored in look-up table 914*a* for both the sine and cosine functions. For example, if $L_{ph}$=8, then look-up table 914*a* only needs to store 32 values.

A register 916*a* stores the sine and cosine values from look-up table 914*a*. A digital-to-analog converter (DAC) 918*a* receives and converts the digital cosine value from register 916*a* to analog and provides the $W_{I1}(n)$ weight. Similarly, a DAC 920*a* receives and converts the digital sine value from register 916*a* to analog and provides the $W_{Q1}(n)$ weight. DACs 918*a* and 920*a* operate on the leading edges of the DCLK signal. The weight generation is pipelined with latch 912*a* and register 916*a* to support higher speed of operation.

Weight generator 240*b* is implemented in the same manner as weight generator 240*a*. However, the $\theta_2(n)$ phase values are latched by a latch 912*b* with the leading edges of the DCLK signal, and a register 916*b* operates on the trailing edges of the DCLK signal. The latch and register within weight generator 240*b* thus operate on the opposite edges of the DCLK signal with respect to the corresponding latch and register within weight generator 240*a*. Weight generators 240*a* and 240*b* are operated in a ping-pong manner so that (1) the outputs of one weight generator are stabilized and can be used by its associated signal generator while (2) the outputs of the other weight generator are allowed to be switched to new values by the DACs.

Look-up tables 914 and DACs 918 and 920 in weight generators 240*a* and 240*b* may be implemented with any number of bits of resolution. For $L_{ph}$=8 and $f_{vco}$=640 MHz, the phase resolution is 6.1 psec, as described above, and the maximum phase error from the 8-bit phase quantization is 3.05 psec, or half of the 6.1 psec phase resolution. For this example, a 6-bit DAC produces a maximum quantization error of 2.37 psec in comparison to a DAC with infinite precision. The maximum expected error for the phase can then be computed to be 5.42 psec, or 3.05+2.37=5.42. This 5.42 psec maximum phase error shows up as random jitter on the output clock signal, where "jitter" is normally defined as the error between the actual phase of the output clock signal and the ideal phase for the clock signal. This 5.42 psec of jitter is normally negligible for a typical application, which may have a jitter requirement of 100 psec or possibly more. The phase error due to the phase quantization may be reduced by using more bits to quantize the $\theta_1(n)$ and $\theta_2(n)$ phase values. The phase error due to the DAC may be reduced by using more bits for the DAC. A finer phase resolution may be supported by a larger sine and cosine look-up table having more entries, and a higher DAC resolution may be supported by having more bits for each entry in the look-up table.

For clarity, a specific design for clock generation system 200 has been described above. Clock generation system 200 may be implemented with various other designs, and this is within the scope of the invention. For example, it may be possible to use a single signal generator 230 and a single weight generator 240 (instead of operating two sets of signal generator and weight generator in a ping-pong manner) if the settling time for these units is sufficiently fast.

Also for clarity, a specific design has been described for each of the units within clock generation system 200. These units may be implemented with other designs, and this is within the scope of the invention. These units may also be implemented with single-ended circuits or differential circuits.

Clock generation system 200 can generate one or more output clock signals having frequencies and phases that can be individually programmed with fine resolution. The output clock signals may have a fixed relationship between them in either frequency and/or phase, and may be considered as synchronous with one another. The desired frequency and phase for each output clock signal can be obtained by continually selecting the proper timing for each edge in the DCLK signal used to generate that output clock signal. The timing of the edges in the DCLK signal is given in terms of the phase of the fixed VCO signal. Phase generator 270 determines the proper timing for each DCLK edge and provides this timing as a $\theta_1(n)$ or $\theta_2(n)$ phase value.

Multiple clock signals may be required for various applications, such as for a digital system with multiple clock domains. A clock domain is typically defined as a group of logic and memory circuits that operate synchronously together. Synchronous operation refers to the use of one or more clock signals having defined frequencies and/or phases. Clock generation system 200 can provide any number of clock signals for any number of clock domains. The clock signals may have the same or different frequencies. The frequency of each clock signal may be independently selected without regard to the frequencies of the other clock signals.

Clock generation system 200 provides various other advantages in addition to those described above. First, only a single PLL is needed to generate all of the required output clock signals. The single-PLL design can reduce component count, minimize the required die area, and lower cost over a conventional multiple-PLL design. The single-PLL design also avoids the noise coupling problem normally encountered in the multiple-PLL design. Second, the single PLL is a fixed PLL having a fixed VCO frequency and a fixed M divide ratio. This fixed PLL may be optimized or tuned for a narrow frequency range and may be designed to have better performance and/or lower cost than a wideband PLL.

Third, clock generation system 200 can provide clock signals with less jitter because of the accuracy in which the clock signals can be generated. The lower jitter may provide improved performance.

The techniques described herein may be used to generate output clock signals, as described above. The techniques may also be used for other purposes, such as for frequency modulation (FM), quadrature amplitude modulation (QAM), and other types of modulation commonly used for communication. The phase and/or amplitude of the two analog signals may be controlled to achieve the desired modulation.

The clock generation system described herein may be implemented within one or more integrated circuits (ICs), application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, and so on. The clock generation system may also be fabricated with various IC process technologies such as bipolar junction transistor (BJT), complementary metal oxide semiconductor (CMOS), bipolar CMOS (Bi-CMOS), gallium arsenide (GaAs), and so on. The clock generation system may also be used for various applications such as personal computers, networking equipment, communication equipment, and so on.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. An integrated circuit comprising:
   a phase generator operative to generate a first sequence of phase values for a first analog signal based on a frequency control value;
   a first weight generator operative to receive the first sequence of phase values and provide a first inphase weight and a first quadrature weight for each phase value in the first sequence;
   a first signal generator operative to receive and multiply inphase and quadrature oscillator signals with first inphase and quadrature weights, respectively, and provide the first analog signal having a frequency and leading edges determined by the phase values in the first sequence; and
   a digital clock generator operative to receive the first analog signal and generate a digital clock signal having a frequency determined by the frequency of the first analog signal.

2. The integrated circuit of claim 1, further comprising:
   a second weight generator operative to receive a second sequence of phase values for a second analog signal and provide a second inphase weight and a second quadrature weight for each phase value in the second sequence; and
   a second signal generator operative to receive and multiply the inphase and quadrature oscillator signals with second inphase and quadrature weights, respectively, and provide the second analog signal having leading edges determined by the phase values in the second sequence, and
   wherein the digital clock generator is operative to generate a third analog signal having a leading edge for each leading edge in the first and second analog signals, and to generate the digital clock signal based on the third analog signal.

3. The integrated circuit of claim 1, further comprising:
   a divider operative to divide the digital clock signal in frequency by an integer value of one or greater and provide an output clock signal having a frequency related to the frequency of the digital clock signal.

4. The integrated circuit of claim 1, wherein the phase generator is further operative to generate the first sequence of phase values for the first analog signal based on a phase offset value.

5. The integrated circuit of claim 1, wherein the phase generator includes
   a first accumulator operative to sum the frequency control value with a first accumulated value and provide a second accumulated value, and
   a second accumulator operative to sum the frequency control value with the second accumulated value and provide the first accumulated value, and
   wherein the first sequence of phase values is obtained from the first accumulator.

6. The integrated circuit of claim 5, wherein the first and second accumulators have at least sixteen bits of resolution.

7. The integrated circuit of claim 1, wherein the first signal generator includes
   a first multiplier operative to multiply the inphase oscillator signal with the first inphase weights and provide a first intermediate signal,
   a second multiplier operative to multiply the quadrature oscillator signal with the first quadrature weights and provide a second intermediate signal, and
   a summer operative to sum the first and second intermediate signals and provide the first analog signal.

8. The integrated circuit of claim 7, wherein the first and second multipliers are implemented with four-quadrant multipliers.

9. The integrated circuit of claim 7, wherein the first and second multipliers are implemented with two-quadrant multipliers.

10. The integrated circuit of claim 1, wherein the first weight generator includes
    a look-up table operative to receive the first sequence of phase values and provide a sine value and a cosine value for each phase value in the first sequence, and
    a first digital-to-analog converter operative to receive the sine value for each phase value in the first sequence and provide the first quadrature weight for the phase value, and
    a second digital-to-analog converter operative to receive the cosine value for each phase value in the first sequence and provide the first inphase weight for the phase value.

11. The integrated circuit of claim 10, wherein each phase value in the first sequence has at least eight bits of resolution and each sine value and each cosine value have at least six bits of resolution.

12. The integrated circuit of claim 1, further comprising:
    an oscillator operative to provide the inphase and quadrature oscillator signals.

13. The integrated circuit of claim 12, wherein the oscillator is part of a phase-locked loop (PLL) and locked in frequency to a reference signal.

14. The integrated circuit of claim 12, wherein the oscillator is operative to provide the inphase and quadrature oscillator signals at a fixed frequency.

15. An apparatus comprising:
  means for generating a first sequence of phase values for a first analog signal based on a frequency control value;
  means for receiving the first sequence of phase values and providing a first inphase weight and a first quadrature weight for each phase value in the first sequence;
  means for multiplying inphase and quadrature oscillator signals with first inphase and quadrature weights, respectively, and providing the first analog signal having a frequency and leading edges determined by the phase values in the first sequence; and
  means for receiving the first analog signal and generating a digital clock signal having a frequency determined by the frequency of the first analog signal.

16. The apparatus of claim 15, further comprising:
  means for receiving a second sequence of phase values for a second analog signal and providing a second inphase weight and a second quadrature weight for each phase value in the second sequence;
  means for multiplying the inphase and quadrature oscillator signals with second inphase and quadrature weights, respectively, and providing the second analog signal having leading edges determined by the phase values in the second sequence; and
  means for generating a third analog signal having a leading edge for each leading edge in the first and second analog signals, and wherein the digital clock signal is generated based on the third analog signal.

17. An integrated circuit comprising:
  a first weight generator operative to receive a first sequence of phase values for a first analog signal and provide a first inphase weight and a first quadrature weight for each phase value in the first sequence;
  a second weight generator operative to receive a second sequence of phase values for a second analog signal and provide a second inphase weight and a second quadrature weight for each phase value in the second sequence;
  a first signal generator operative to receive and multiply inphase and quadrature oscillator signals with first inphase and quadrature weights, respectively, and provide the first analog signal having a frequency and leading edges determined by the phase values in the first sequence;
  a second signal generator operative to receive and multiply the inphase and quadrature oscillator signals with second inphase and quadrature weights, respectively, and provide the second analog signal having leading edges determined by the phase values in the second sequence and same frequency as the first analog signal; and
  a digital clock generator operative to receive the first and second analog signals, generate a third analog signal having a leading edge for each leading edge in the first and second analog signals, and generate a digital clock signal having a frequency determined by the frequency of the first and second analog signals.

18. A clock generation system comprising:
  an oscillator operative to provide inphase and quadrature oscillator signals having a fixed frequency; and
  at least one clock generator, each clock generator comprising
    a phase generator operative to generate a first sequence of phase values for a first analog signal based on a frequency control value,
    a first weight generator operative to receive the first sequence of phase values and provide a first inphase weight and a first quadrature weight for each phase value in the first sequence,
    a first signal generator operative to receive and multiply inphase and quadrature oscillator signals with first inphase and quadrature weights, respectively, and provide the first analog signal having a frequency and leading edges determined by the phase values in the first sequence, and
    a digital clock generator operative to receive the first analog signal and generate a digital clock signal having a frequency determined by the frequency of the first analog signal.

19. The clock generation system of claim 18, wherein each clock generator further comprises
  a second weight generator operative to receive a second sequence of phase values for a second analog signal and provide a second inphase weight and a second quadrature weight for each phase value in the second sequence, and
  a second signal generator operative to receive and multiply the inphase and quadrature oscillator signals with second inphase and quadrature weights, respectively, and provide the second analog signal having leading edges determined by the phase values in the second sequence, and
  wherein the digital clock generator is further operative to generate a third analog signal having a leading edge for each leading edge in the first and second analog signals and to generate the digital clock signal based on the third analog signal.

20. The clock generation system of claim 18, and comprising a plurality of clock generators, each clock generator generating a respective digital clock signal, and wherein the frequency of the digital clock signal for each clock generator is individually programmable.

* * * * *